United States Patent
Hase et al.

(10) Patent No.: US 7,119,878 B2
(45) Date of Patent: Oct. 10, 2006

(54) EXPOSURE APPARATUS AND METHOD OF CLEANING OPTICAL ELEMENT OF THE SAME

(75) Inventors: Tomoharu Hase, Utsunomiya (JP); Yukio Yamane, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 9 days.

(21) Appl. No.: 11/185,780

(22) Filed: Jul. 21, 2005

(65) Prior Publication Data

US 2006/0001853 A1    Jan. 5, 2006

Related U.S. Application Data

(60) Division of application No. 09/876,103, filed on Jun. 8, 2001, which is a continuation of application No. 09/240,839, filed on Feb. 1, 1999, now Pat. No. 6,252,648.

(30) Foreign Application Priority Data

Feb. 4, 1998    (JP)    ............................... 1998-023278

(51) Int. Cl.
G03B 27/32    (2006.01)
G03B 27/42    (2006.01)

(52) U.S. Cl. ............................. 355/53; 355/30; 355/67

(58) Field of Classification Search ................. 355/30, 355/53, 67; 359/507, 509, 513; 250/492.2
See application file for complete search history.

(56) References Cited

U.S. PATENT DOCUMENTS

| | | | |
|---|---|---|---|
| 3,818,496 A | 6/1974 | Lee et al. ...................... 354/75 |
| 4,690,528 A | 9/1987 | Tanimoto et al. ............ 353/101 |
| 4,704,348 A * | 11/1987 | Koizumi et al. ............... 355/53 |
| 4,786,947 A | 11/1988 | Kosugi et al. ................. 355/30 |
| 4,825,247 A | 4/1989 | Kemi et al. .................... 355/55 |
| 5,425,045 A | 6/1995 | Hamatani .................... 372/101 |
| 5,430,303 A | 7/1995 | Matsumoto et al. ..... 250/492.2 |
| 5,454,347 A | 10/1995 | Shibata et al. .............. 117/202 |
| 5,499,076 A | 3/1996 | Muraki ........................ 355/53 |
| 5,539,180 A | 7/1996 | Mori et al. ............ 219/121.64 |
| 5,559,584 A * | 9/1996 | Miyaji et al. ................. 355/30 |
| 5,602,683 A | 2/1997 | Straaijer et al. ............ 359/811 |
| 5,681,759 A | 10/1997 | Zhang .......................... 437/21 |
| 5,696,623 A | 12/1997 | Fujie et al. ................. 359/350 |
| 5,699,183 A | 12/1997 | Hiraiwa et al. ............. 359/355 |
| 5,763,855 A | 6/1998 | Shioji .................... 219/121.84 |
| 5,771,260 A | 6/1998 | Elliott et al. ................ 372/109 |

(Continued)

FOREIGN PATENT DOCUMENTS

JP    1-228687    9/1989

(Continued)

*Primary Examiner*—Geoffrey S. Evans
(74) *Attorney, Agent, or Firm*—Fitzpatrick, Cella, Harper & Scinto

(57) ABSTRACT

An exposure apparatus for exposing a substrate to a pattern of a mask by use of exposure light. The apparatus includes an optical system for directing the exposure light from a light source to the substrate, the optical system having an optical element, a first casing for accommodating therein an optical surface of the optical element, and a second casing for accommodating therein the optical element and the first casing, a first port provided in the first casing, a second port provided in the second casing, a supplier for supplying an inert gas into the first casing and the second casing, and a supplier for supplying an inert gas into the first casing and the second casing through the first port and the second port.

9 Claims, 4 Drawing Sheets

U.S. PATENT DOCUMENTS

| | | | |
|---|---|---|---|
| 5,812,242 A | 9/1998 | Tokuda | 355/30 |
| 5,838,426 A | 11/1998 | Shinonaga et al. | 355/52 |
| 5,883,704 A | 3/1999 | Nishi et al. | 355/67 |
| 5,892,572 A | 4/1999 | Nishi | 355/67 |
| 6,027,262 A | 2/2000 | Akimoto | 396/611 |
| 6,031,598 A | 2/2000 | Tichenor et al. | 355/67 |
| 6,191,843 B1 | 2/2001 | Takiguchi | 355/30 |
| 6,222,610 B1 | 4/2001 | Hagiwara et al. | 355/30 |
| 6,252,648 B1 | 6/2001 | Hase et al. | 355/53 |
| 6,288,769 B1 * | 9/2001 | Akagawa et al. | 355/30 |
| 6,335,787 B1 * | 1/2002 | Nishi | 355/67 |
| 6,341,006 B1 * | 1/2002 | Murayama et al. | 355/53 |
| 6,522,384 B1 | 2/2003 | Miwa | 355/30 |
| 6,630,985 B1 * | 10/2003 | Hase | 355/30 |
| 6,853,439 B1 * | 2/2005 | Hase | 355/30 |
| 6,961,114 B1 * | 11/2005 | Murayama et al. | 355/30 |

FOREIGN PATENT DOCUMENTS

| | | |
|---|---|---|
| JP | 6-204114 | 7/1994 |
| JP | 6-216000 | 8/1994 |
| JP | 7-209569 | 8/1995 |
| JP | 9-70682 | 3/1997 |
| JP | 9-162117 | 6/1997 |
| WO | WO-99/50892 A1 * | 10/1999 |

* cited by examiner

EXPOSURE APPARATUS AND METHOD OF CLEANING OPTICAL ELEMENT OF THE SAME

This application is a divisional application of copending U.S. patent application Ser. No. 09/876,103, filed Jun. 8, 2001, which is a continuation of application Ser. No. 09/240,839, filed Feb. 1, 1999, which issued as U.S. Pat. No. 6,252,648 B1 on Jun. 26, 2001.

FIELD OF THE INVENTION AND RELATED ART

This invention relates generally to an exposure apparatus which uses, as an exposure beam, short wavelength electromagnetic waves such as X-rays or ultraviolet rays from an excimer laser, for example. More specifically, the invention is concerned with such an exposure apparatus, a device manufacturing method using the same, and a method of cleaning an optical element of such an exposure apparatus.

In projection exposure apparatuses for the manufacture of semiconductor integrated circuits, light of various wavelength bands is projected as an exposure beam to a substrate. As for such an exposure beam, examples are e-line (wavelength $\lambda=546$ nm), g-line ($\lambda=436$ nm), h-line ($\lambda=405$ nm), i-line ($\lambda=365$ nm), a KrF excimer laser ($\lambda=248$ nm), an ArF exciter laser ($\lambda=193$ nm), and X-rays.

An exposure beam emitted from a light source is directed by way of an illumination optical system for illuminating a reticle and a projection optical system (projection lens) for imaging a fine pattern formed on the reticle upon a photosensitive substrate, whereby the fine pattern is lithographically transferred to the photosensitive substrate. In such exposure apparatuses, miniaturization of the pattern linewidth has forced further improvements of throughput and resolution. Also, an exposure beam of a higher power has been required and, on the other hand, shortening of the wavelength band of an exposure beam has been required.

It is known that when an exposure beam of i-line (wavelength $\lambda=365$ nm) or a shorter wavelength is used, due to shortening of the wavelength, impurities in the air photochemically may react with oxygen. The product (blurring material) of such a reaction may be deposited on an optical element (lens or mirror) of the optical system, causing non-transparent "blur".

As regards such a blurring material, in a case where sulfuric acid $SO_2$ absorbs light energy and it is excited thereby, a typical example may be ammonium sulfate $(NH_4)_2 SO_4$ produced by a reaction (oxidization) with oxygen in the air. When such ammonium sulfate is deposited on the surface of an optical element such as a lens or mirror, the above-described "blur" results. Then, the exposure beam is scattered or absorbed by the ammonium sulfate, so that the transmission factor of the optical system decreases. This causes a large decrease of light quantity (transmission factor) upon the photosensitive substrate, and thus a decrease of throughput.

Particularly, for an ArF excimer laser (193 nm) or X-rays which are in a very short wavelength region, the exposure beam may cause a strong photochemical reaction. Thus, the above-described problems are very serious.

SUMMARY OF THE INVENTION

Japanese Laid-Open Patent Application, Laid-Open No. 216000/1994 shows an arrangement wherein a barrel having mounted therein a glass member such as a lens is provided in a casing of a closed structure, and wherein the inside of the casing is filled with an inert gas, thereby to solve the problem such as described above.

However, it has been found that, in such an example using inert gas, an optical element within the barrel or casing of the illumination optical system may be contaminated by organic molecules. These molecules may be those of any solvent, for example, used during manufacturing and working processes of components of the illumination optical system and remaining on the components, or those of an adhesive agent used in the casing or barrel and evaporated therefrom.

Taking the manufacturing procedure into consideration, the environmental air may be contaminated by organic molecules coming from an adhesive agent layer between a substrate and a photoresist, for example. These molecules may enter the casing or barrel. Even if the organic molecules are at a low concentration, particles may be decomposed due to the influence of an ultraviolet beam and they may be deposited on the optical element. On that occasion, a carbon film or a film containing carbon will be produced on the element surface.

Japanese Laid-Open Patent Application, Laid Open No. 209569/1995 shows an arrangement wherein, when an inert gas is supplied into a projection optical system, a small amount of ozone is mixed into the inert gas, such that an inert gas containing ozone is supplied to an optical system. The optical element is irradiated with an exposure beam in a gas ambience containing ozone and, due to an ozone cleaning effect, decomposition of organic molecules on the surface of the optical element as well as deposition of products of the decomposition thereon are prevented.

In this structure, however, an ozone generator having a Hg lamp is provided in a portion of an inert gas supplying line. The ozone generator produces ozone beforehand, and then the ozone is supplied into the lens holder. This structure needs use of two light sources, that is, the exposure light source and the ozone generating light source. The structure is thus complicated. Further, this creates the following dangerous possibilities. That is, ozone has a property for deteriorating an element. Therefore, the ozone generator itself may be easily damaged by the influence of ozone. Thus, there is a possibility of leakage of harmful ozone from the damaged ozone generator.

It is an object of the present invention to provide an exposure apparatus by which contamination of an optical element by organic molecules can be prevented, particularly, very simply and effectively.

It is another object of the present invention to provide a device manufacturing method using such an exposure apparatus and/or a method of cleaning an optical element of an exposure apparatus.

In accordance with an aspect of the present invention, there is provided an exposure apparatus, comprising: a light source for producing an exposure beam; an optical system having a closed space, for projecting the exposure beam to a substrate for exposure thereof; first supplying means for supplying an inert gas into the closed space of said optical system; and second supplying means for supplying one of oxygen and clean air, so that the inert gas and oxygen can be supplied to the closed space.

In accordance with another aspect of the present invention, there is provided a device manufacturing method comprising the steps of: providing an exposure apparatus as recited above; and performing an exposure process by use of the exposure apparatus.

In accordance with a further aspect of the present invention, there is provided a method of cleaning an optical element of an exposure apparatus for exposing a substrate with an exposure beam of ultraviolet rays or X-rays, projected thereto, said method comprising the steps of: supplying an inert gas containing a small amount of oxygen into a space in which the optical element is placed; projecting the exposure beam so that ozone is produced in the space; and removing an organic compound deposited on the optical element through a photochemical reaction by projection of the exposure beam and the produced ozone.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
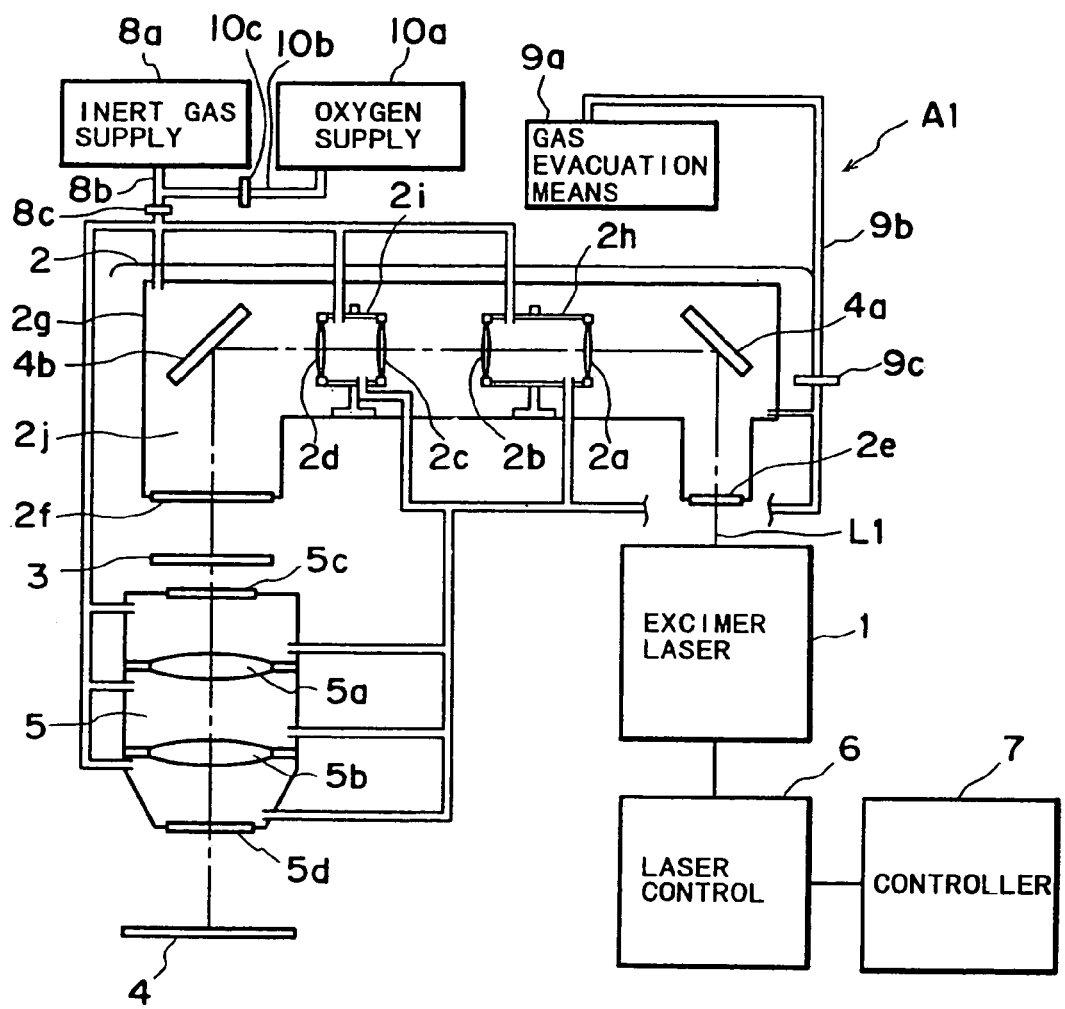
FIG. 1 is a schematic view of a general structure of an exposure apparatus according to an embodiment of the present invention.

Preferred embodiments of the present invention will now be described with reference to the accompanying drawings. In an embodiment of the present invention to be described below, the invention is applied to an exposure apparatus of a reduction projection type, which is generally called a stepper or a scanner.

The exposure apparatus A1 has a major assembly which may be roughly separated into a light source 1 (ArF excimer laser light source), a light source lens system 2 which comprises an illumination optical system for transforming laser light L1, which is illumination light emitted from the light source 1, into light of a predetermined shape, and a projection lens system 5 for imaging the laser light L1, having been formed into a predetermined shape by the light source lens system 2, upon a wafer 4 (substrate) through a reticle 3. The light source 1 includes a laser control device 6 for controlling a laser output of the same. The laser control device 6 is controlled by a controller 7 (control means). The laser control device 6 functions to change the emission laser wavelength region, to be described later.

In this embodiment, the light source comprises an ArF excimer laser which produces ultraviolet rays. However, it may comprise a KrF excimer laser light source or, alternatively, an X-ray source for producing shorter wavelength X-rays (X-rays are referred to generally as soft X-rays or vacuum ultraviolet rays, for example), such as a synchrotron radiation source or a laser plasma radiation source, for example.

The light source lens system 2 comprises barrels 2h and 2i in which a plurality of lenses 2a–2d are disposed therewithin. These barrels are accommodated in a casing 2g. Disposed on the opposite sides of them are mirrors 4a and 4b for deflecting and directing the laser light along a path. The casing 2g of the illumination optical system has a window 2e demountably mounted at an entrance opposed to the light source L and also a window 2f at an exit opposed to a reticle 3.

The projection optical system 5 has a plurality of lenses 5a and 5b accommodated in a lens barrel, for projecting a pattern of the reticle onto a wafer in a reduced scale. There are windows 5c and 5d mounted on the faces opposed to the reticle and the wafer, respectively.

Inert gas of nitrogen gas (it may be a gas of helium or neon, for example) is supplied to an inside space 2j of the casing 2g of the illumination optical system 2, to the inside spaces of the barrels 2h and 2i, and to the spaces inside the projection lens 5 and the lens barrel as separated by lenses. Inert gas supplying device 8a is connected to these spaces through an inert gas supplying line 8b and an electromagnetic valve 8c (opening/closing valve) provided in a portion of this line. At an intermediate position on the inert gas supplying line 8b, there is an oxygen supplying line 10b connected as a branch. Through an electromagnetic valve 10c (opening/closing valve) provided in a portion of this line, an oxygen supplying device 10a is connected thereto. This enables mixture of a small amount of oxygen into the inert gas to be supplied. In place of pure oxygen, clean air which contains oxygen may be mixed.

There is a gas discharging device 9a for discharging gases from these spaces to which inert gas is supplied. These spaces are connected to the gas discharging device 9a through a gas discharging line 9b and an electromagnetic valve 9c (opening/closing valve) provided in a portion of this line.

The gas collected by the gas discharging means may include a small amount of residual ozone. The gas discharging device 9a may be provided with converter means for re-converting the residual ozone into oxygen. Impurities may be removed by a filter and thereafter the oxygen thus re-converted may be circulated to the oxygen supplying device 10a, for reuse thereof.

The electromagnetic valves 8c and 9c provided in portions of the line for the inert gas supplying means and for the gas discharging means are controlled in accordance with a program set in the controller 7 beforehand, so that the spaces are kept in a state as filled with inert gas, during normal operation of the apparatus (exposure process) or a stand-by period.

More specifically, in accordance with preset timing, in the stand-by state of the apparatus, the electromagnetic valve 10c of the oxygen supplying line opens so that a small amount of oxygen is mixed into the nitrogen gas. The resultant gas is supplied into the casing and barrels of the illumination optical system and also into the barrel of the projection optical system. The opening/closing of the electromagnetic valve is controlled so that the amount of oxygen supply is kept not greater than a predetermined concentration (e.g., not greater than a few grams per 1 $m^3$). After the mixture gas is supplied, the electromagnetic valves 8c and 9c are closed. In the state in which the spaces are filled with a gas in which a small amount of oxygen is mixed into a nitrogen gas, projection of laser light is performed. In response to this, in these spaces, oxygen within the inert gas, filling the space, is converted into ozone through a photochemical reaction. Thus, in these spaces, ozone is produced first. Laser projection is continued in this state and, as a result, any organic compound deposited on optical elements (lenses, mirrors or windows) constituting the optical system is oxidized. Consequently, organic molecules on the optical element are removed by ozone cleaning, whereby the optical element is cleaned.

Subsequently, the electromagnetic valves on the inert gas supplying line and the gas discharging line are opened, and supply of inert gas and discharging of the gas are continued interruptedly or uninterruptedly until the inside gas is completely replaced by nitrogen gas. The series of these sequential operations is performed in accordance with a program set in the controller beforehand. As regards the cleaning of the optical elements, it may preferably be made during the stand-by period of the apparatus in which the apparatus is held inoperative, since it does not influence the throughput. Alternatively, cleaning may be made during actual operation of the apparatus.

The efficiency of producing ozone from oxygen by light projection largely depends on the wavelength of light projected. In consideration of this, in order to assure efficient production of ozone, the wavelength of the exposure beam may preferably be changed, between the exposure process for a substrate and the cleaning operation for the optical elements. More specifically, for the cleaning operation, preferably the wavelength region may be oscillated continuously or it may be changed to a shorter wavelength side, by which the ozone production efficiency and thus the cleaning capacity can be improved. Changing the wavelength may be accomplished by controlling the light source actuation or by inserting wavelength changing means (such as a harmonic wave producing element, for example) into the light path, for example.

Figure 2:
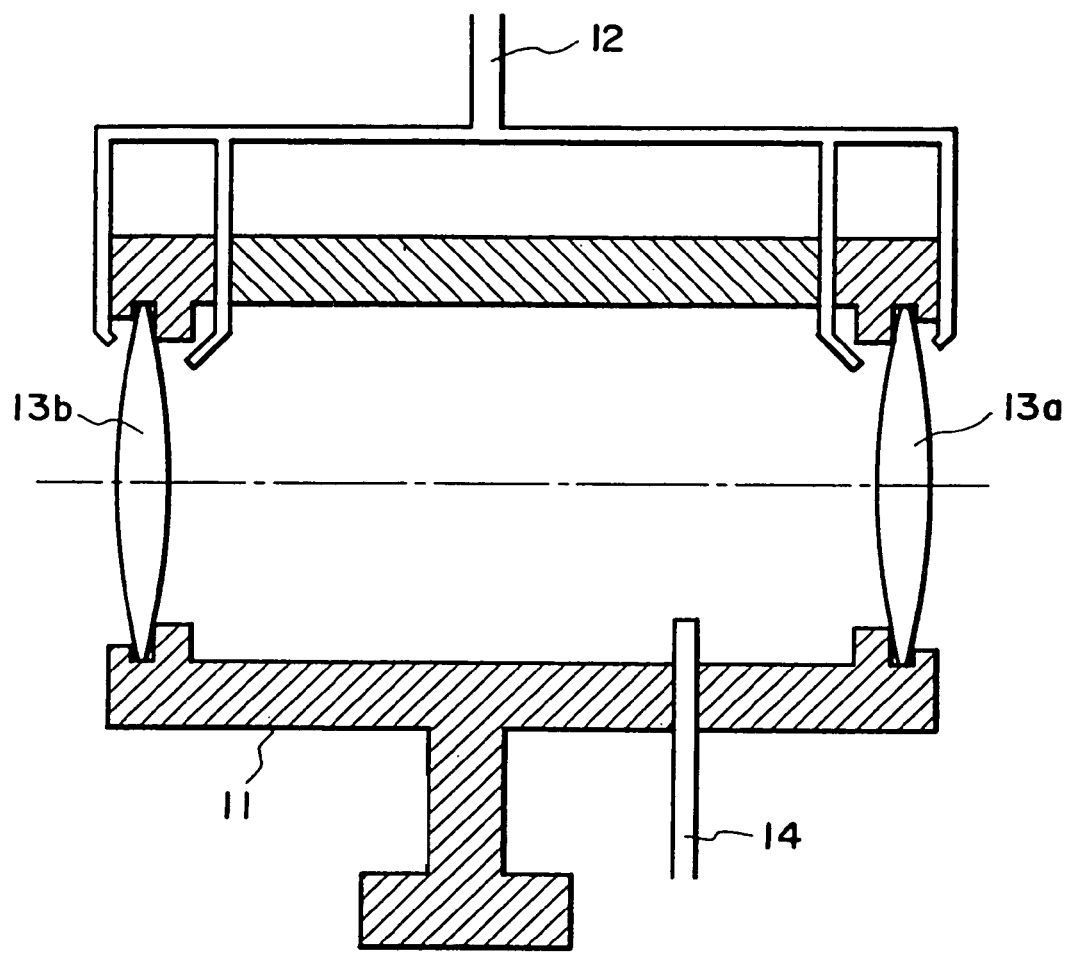
FIG. 2 is a sectional view for explaining an example of an inside structure of a barrel.
Figure 3:
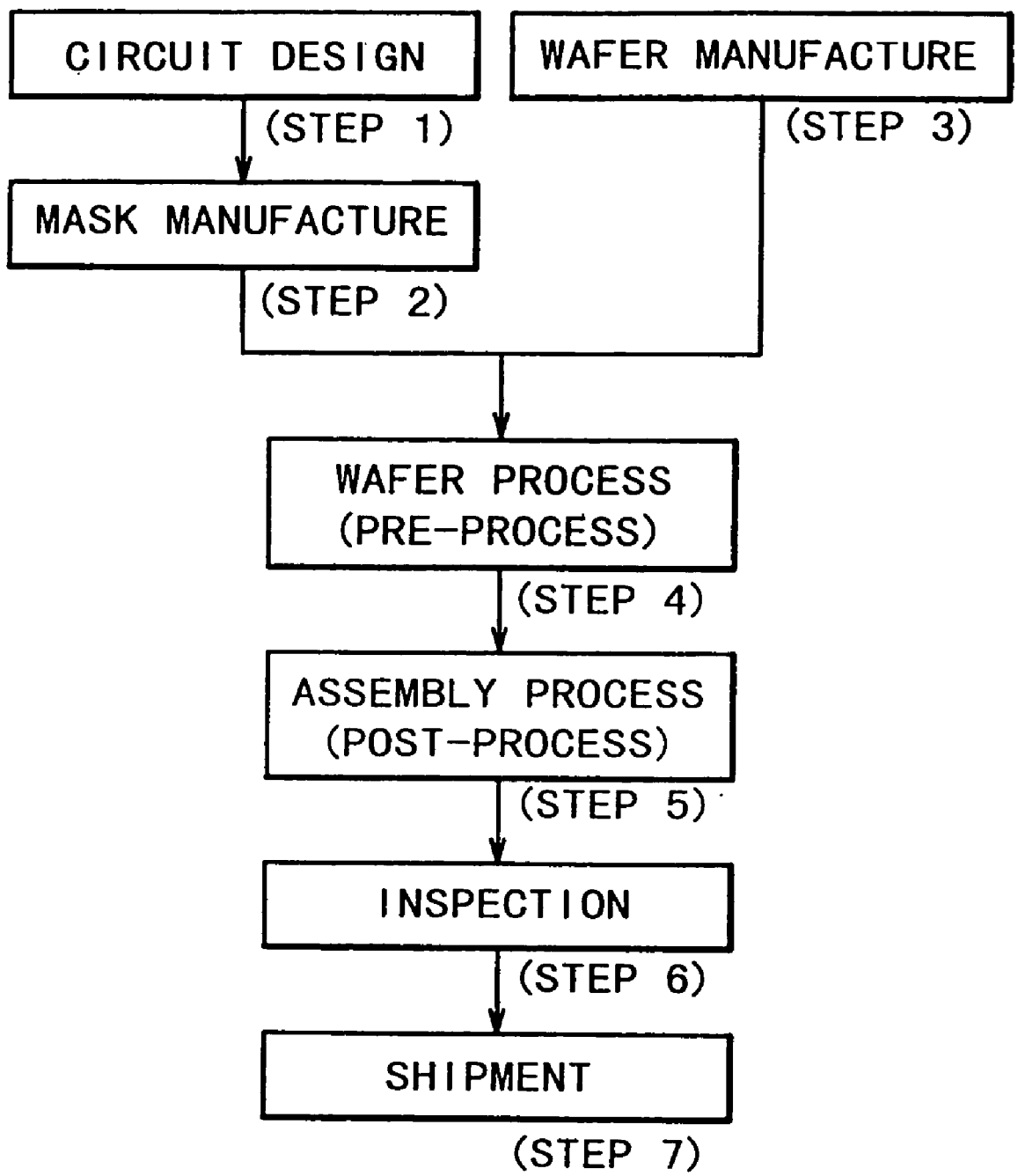
FIG. 3 is a flow chart of device manufacturing processes.

FIG. 2 is an enlarged view of a portion of the barrel 2h of the illumination optical system, in the neighborhood of a gas blowing port of the inert gas supplying line. As regards optical elements 13a and 13b, it is expected that a large amount of organic molecules may be deposited on these elements. Thus, the structure is so arranged that the inert gas is directly blown against these optical elements. This enhances the ozone cleaning effect considerably.

The inert gas supplying line may be provided with flow rate changing means such as disclosed in Japanese Laid-Open Patent Application, Laid-Open No. 216000/1994, so that nitrogen can be supplied at a large flow rate for the impurity removing operation.

The exposure apparatus may include optical elements other than lenses, mirrors or windows as described. An example is a filter for transmitting only a desired wavelength of light among a broad wavelength band as emitted by a light source such as a Hg lamp or synchrotron radiation source. The advantageous effects of the present invention described above similarly apply to such an optical element.

Next, an embodiment of a device manufacturing method which uses an exposure apparatus such as described above, will be explained.

FIG. 9 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

FIG. 10 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with an exposure apparatus of the present invention, the problem of deposition of organic molecules on an optical element and reduction of illuminance thereby can be removed. Since the exposure beam itself to be used for the exposure process is used also for ozone production, use of an additional and a large mechanism is not necessary. Further, since ozone production is made only inside a closed space in which the optical element is disposed, there is no dangerous possibility of leakage of harmful ozone.

Since the exposure apparatus provides high throughput constantly, a high productivity is accomplished in the device manufacture.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a substrate to light via a mask, said apparatus comprising:
   an optical system configured to direct light from a light source to the substrate via the mask;
   a barrel which holds a plurality of optical elements included in said optical system;
   a casing which accommodates therein said plurality of optical elements and said barrel;
   a first supplying line having a first port which is arranged in a first space, the first space being a space surrounded by said barrel and said plurality of optical elements;
   a second supplying line having a second port which is arranged in a second space, the second space being a space inside said casing and outside said barrel, said plurality of optical elements and the first space;
   a first discharging line having a third port which is arranged in the first space;
   a second discharging line having a fourth port which is arranged in the second space;
   a supplier configured to supply an inert gas into the first and second spaces through said first and second supplying lines; and
   an exhauster configured to exhaust gas from the first and second spaces through said first and second discharging lines.

2. An apparatus according to claim 1, further comprising (i) a third supplying line having a fifth port which is arranged in the first space, (ii) a fourth supplying line having a sixth port which is arranged in the second space, and (iii) a second supplier configured to supply a gas which contains oxygen into the first and second spaces through said third and fourth supplying lines.

3. An apparatus according to claim 2, wherein said first port is the same as said fifth port, and said second port is the same as said sixth port.

4. A device manufacturing method, comprising steps of:
exposing a substrate to light via a mask by use of an exposure apparatus as defined in claim 1;
developing the exposed substrate; and
processing the developed substrate to produce a device.

5. An exposure apparatus for exposing a substrate to light via a mask, said apparatus comprising:
an optical system configured to direct light from a light source to the substrate via the mask;
a barrel which holds a plurality of optical elements included in said optical system;
a casing which accommodates therein said plurality of optical elements and said barrel;
a first supplying line having a first port which is arranged in a first space, the first space being a space surrounded by said barrel and said plurality of optical elements;
a second supplying line having a second port which is arranged in a second space, the second space being a space inside said casing and outside said barrel, said plurality of optical elements and the first space, said second supplying line being parallel with said first supplying line; and a supplier configured to supply an inert gas into the first and second spaces through said first and second supplying lines.

6. An apparatus according to claim 5, further comprising (i) a first discharging line having a third port which is arranged in the first space, (ii) a second discharging line having a fourth port which is arranged in the second space, and (iii) an exhauster configured to exhaust gas from the first and second spaces through said first and second discharging lines.

7. An apparatus according to claim 5, further comprising (a) a third supplying line having a fifth port which is arranged in the first space, (b) a fourth supplying line having a sixth port which is arranged in the second space, and (c) a second supplier configured to supply gas which contains oxygen into the first and second spaces through said third and fourth supplying lines.

8. An apparatus according to claim 7, wherein said first port is the same as said fifth port, and said second port is the same as said sixth port.

9. A device manufacturing method, comprising steps of:
exposing a substrate to light via a mask using an exposure apparatus as defined in claim 5;
developing the exposed substrate; and
processing the developed substrate to produce a device.

* * * * *

UNITED STATES PATENT AND TRADEMARK OFFICE
CERTIFICATE OF CORRECTION

PATENT NO.       : 7,119,878 B2
APPLICATION NO.  : 11/185780
DATED            : October 10, 2006
INVENTOR(S)      : Tomoharu Hase et al.

It is certified that error appears in the above-identified patent and that said Letters Patent is hereby corrected as shown below:

ON THE TITLE PAGE:
In item "(30) Foreign Application Priority Data," "Feb. 4. 1998 (JP) …… 1998-023278" should read -- Feb. 4, 1998 (JP) …….. 10-023278 --.

Figure 4:
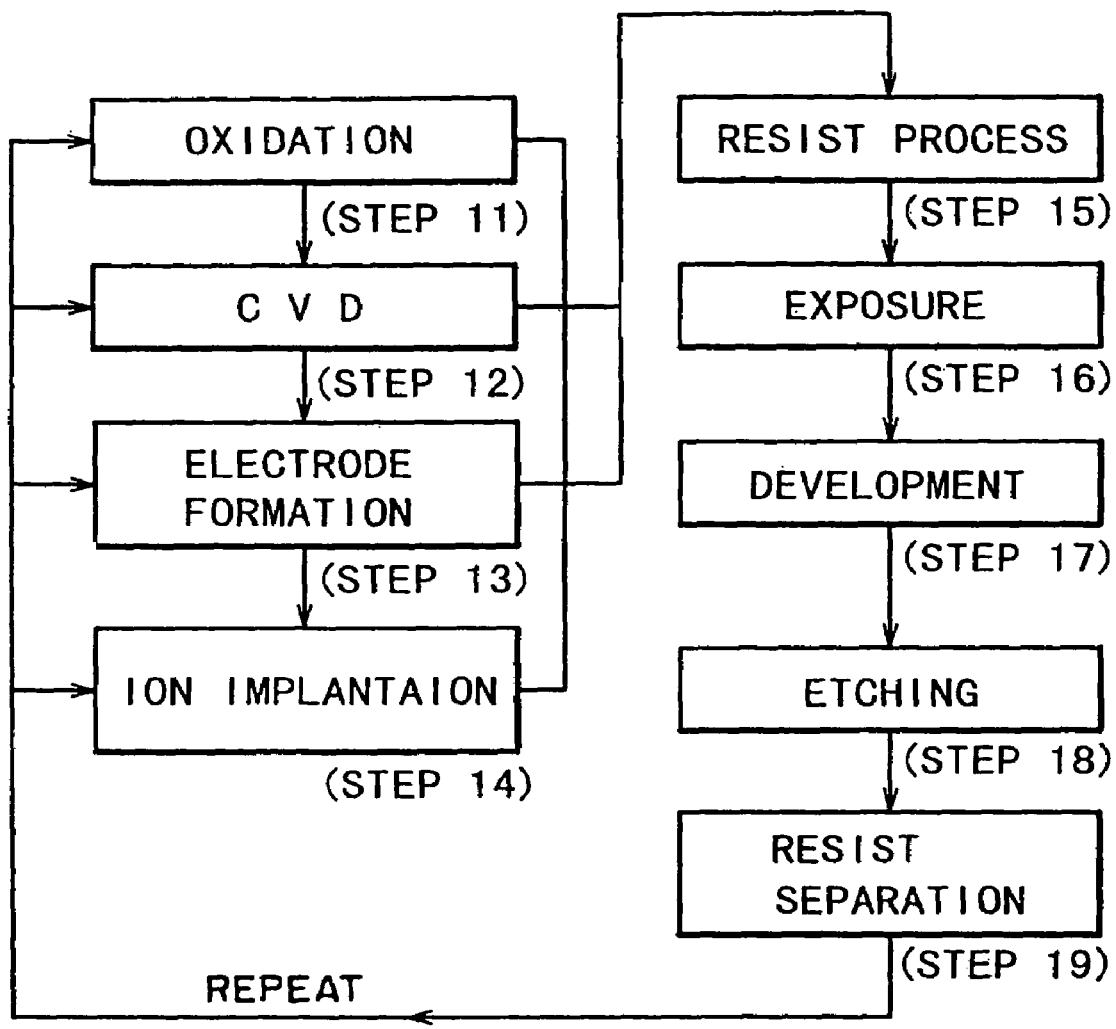
FIG. 4 is a flow chart for explaining details of a wafer process.
Figure 4:
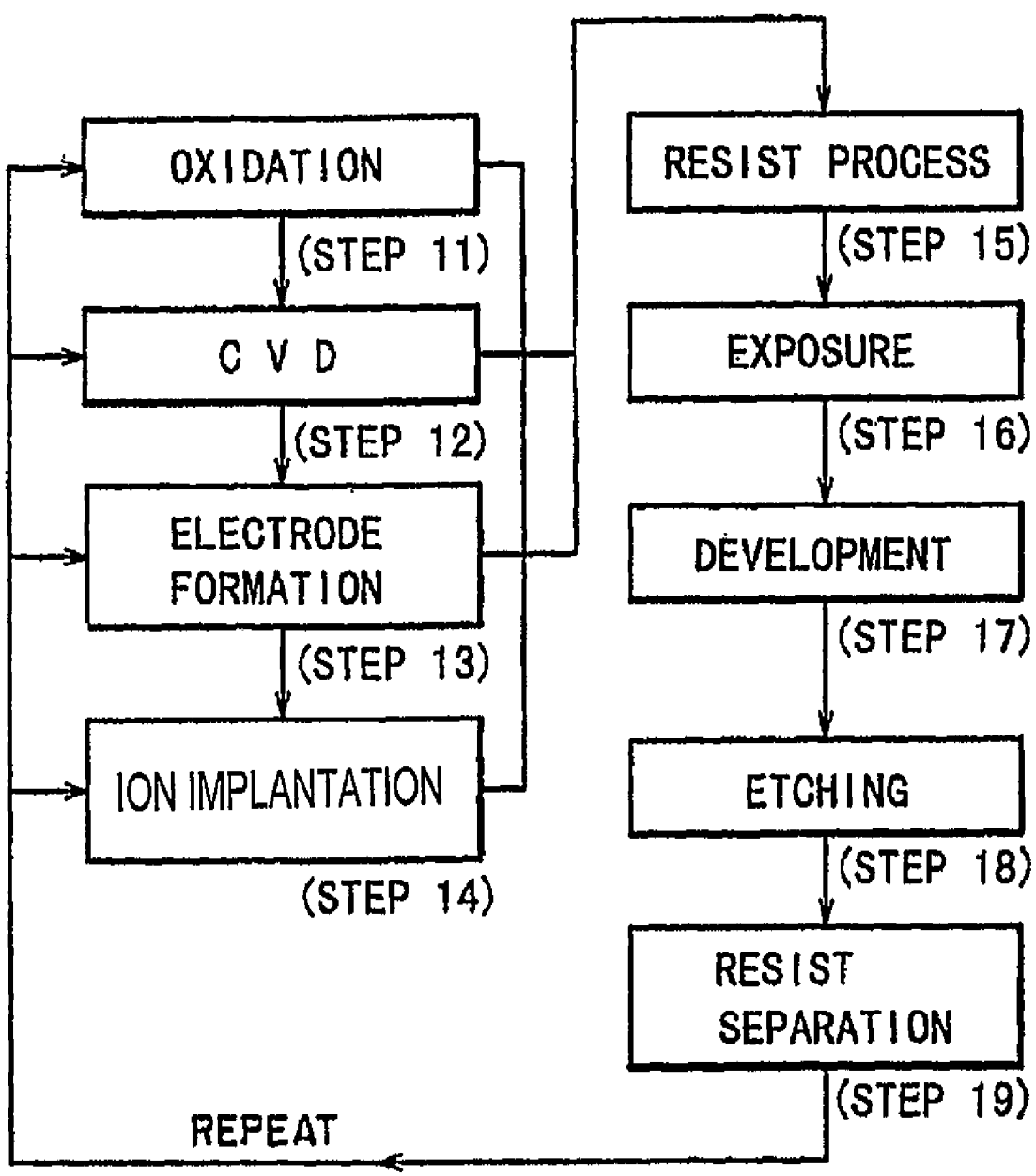

IN THE DRAWINGS:
Sheet 4 of 4, "FIG. 4," in the box labeled "(STEP 14)," "IMPLANATION" should read -- IMPLANTATION --. As shown in attached COLUMN 1:
Line 26, "exciter" should read -- excimer --.

COLUMN 4:
Line 32, "thereafter" should read -- thereafter, --.
Line 53, "9*c*are" should read -- 9*c* are --.

Signed and Sealed this

Twelfth Day of June, 2007

JON W. DUDAS
*Director of the United States Patent and Trademark Office*